(12) United States Patent
Findeklee

(10) Patent No.: US 10,539,636 B2
(45) Date of Patent: Jan. 21, 2020

(54) MULTI-CHANNEL TRANSMIT/RECEIVE RADIO FREQUENCY (RF) SYSTEM WHICH INDIVIDUALLY MONITORS CURRENTS IN EACH OF A PLURALITY OF ANTENNA ELEMENTS OF A MAGNETIC RESONANCE (MR) IMAGING COIL SYSTEM

(71) Applicant: KONINKLIJKE PHILIPS N.V., Eindhoven (NL)

(72) Inventor: Christian Findeklee, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 86 days.

(21) Appl. No.: 15/568,523

(22) PCT Filed: Apr. 25, 2016

(86) PCT No.: PCT/EP2016/059124
§ 371 (c)(1),
(2) Date: Oct. 23, 2017

(87) PCT Pub. No.: WO2016/170177
PCT Pub. Date: Oct. 27, 2016

(65) Prior Publication Data
US 2018/0156879 A1 Jun. 7, 2018

(30) Foreign Application Priority Data
Apr. 24, 2015 (EP) ...................................... 15165050

(51) Int. Cl.
*G01R 33/36* (2006.01)
*G01R 33/561* (2006.01)
*G01R 33/28* (2006.01)

(52) U.S. Cl.
CPC ....... *G01R 33/3635* (2013.01); *G01R 33/288* (2013.01); *G01R 33/3692* (2013.01); *G01R 33/5612* (2013.01); *G01R 33/3614* (2013.01)

(58) Field of Classification Search
CPC ............ G01R 33/3635; G01R 33/3692; G01R 33/288; G01R 33/5612; G01R 33/36; G01R 33/3614
See application file for complete search history.

(56) References Cited

U.S. PATENT DOCUMENTS 5,262,725 A * 11/1993 Cuppen ................ G01R 33/565
324/309
5,515,855 A * 5/1996 Meyer .............. G01R 33/34046
324/318

(Continued)

FOREIGN PATENT DOCUMENTS

JP 2013144066 A 7/2013

OTHER PUBLICATIONS

Graesslin "Comprehensive RF Safety Concept for Parallel Transmission MR" PIERS Proceedings, Cambridge, MA, US Jul. 2-6, 2008.

(Continued)

*Primary Examiner* — G. M. A Hyder

(57) ABSTRACT

A multi-channel transmit/receive radio frequency (RF) system for a magnetic resonance examination system with an RF antenna array includes multiple antenna elements and an RF power supply to supply electrical RF power to the antenna elements. Directional couplers are circuited between respective antenna elements and a power distributor. A monitoring module is configured to measure forward electrical wave amplitude(s) and reflected electrical wave amplitude(s) at individual directional couplers. An arithmetic module is configured to compute individual coil element (Continued)

currents on the basis of the measured forward and reflected electrical wave amplitudes.

5 Claims, 2 Drawing Sheets

(56) References Cited

U.S. PATENT DOCUMENTS

| | | | |
|---|---|---|---|
| 7,800,368 B2 | 9/2010 | Vaughan et al. | |
| 8,547,097 B2 | 10/2013 | Gebhardt et al. | |
| 8,686,726 B2 | 4/2014 | Katscher et al. | |
| 2008/0088305 A1* | 4/2008 | Olson | G01R 33/246 324/309 |
| 2008/0157765 A1 | 7/2008 | Fontius et al. | |
| 2008/0227416 A1* | 9/2008 | Nistler | G01R 33/34076 455/101 |
| 2009/0128153 A1* | 5/2009 | Graesslin | G01R 33/3607 324/322 |
| 2010/0167668 A1 | 7/2010 | Nistler et al. | |
| 2010/0244840 A1 | 9/2010 | McKinnon | |
| 2011/0043205 A1 | 2/2011 | Graesslin et al. | |
| 2011/0148418 A1* | 6/2011 | Findeklee | H01P 5/12 324/318 |
| 2012/0032678 A1* | 2/2012 | Vaughan, Jr. | G01R 33/3415 324/318 |
| 2012/0153951 A1* | 6/2012 | Kozlov | G01R 33/3415 324/313 |
| 2013/0285659 A1* | 10/2013 | Sohn | G01R 33/34092 324/314 |
| 2014/0139218 A1* | 5/2014 | Findeklee | G01R 33/3628 324/318 |
| 2014/0307764 A1 | 10/2014 | Adolf et al. | |
| 2016/0033591 A1* | 2/2016 | Leussler | G01R 33/288 324/309 |

OTHER PUBLICATIONS

Gagoski "Real-Time RF Monitoring in a 7T Parallel Transmit System" In "Magnetic Resonance Spectroscopic Imaging Using Parallel Transmissin at 7T" MIT, Jan. 1, 2011, p. 71-86.

Brote et al "RF Monitoring of the Complex Waveforms of an 8-Channel Multi-Transmit System at 7T Utilizing Directional Couplers and I/Q Demodulators" Proceedings of the International Soc. for Mag. Reson. in Med, May 7-13, 2011, p. 3849.

F. Seifert et al.: Patient safety concept for multichannel transmit coils. JMRI 2007;26:1315-1321.

M. Restivo et al.: Local SAR Estimation for Parallel RF Transmit at 7T Using Directional Couplers. Subitted for ISMRM2015.

Bitz et al, "Evaluation of Virtual Observation Points for Local SAR Monitoring of Multi-Channel Transmit RF Coils at 7 Tesla", Proc. Intl. Soc. Mag. Reson. Med 21 (2013) p. 4414.

* cited by examiner

MULTI-CHANNEL TRANSMIT/RECEIVE RADIO FREQUENCY (RF) SYSTEM WHICH INDIVIDUALLY MONITORS CURRENTS IN EACH OF A PLURALITY OF ANTENNA ELEMENTS OF A MAGNETIC RESONANCE (MR) IMAGING COIL SYSTEM

CROSS REFERENCE TO RELATED APPLICATIONS

This application is a U.S. national phase application of International Application No. PCT/EP2016/059124, filed on Apr. 25, 2016, which claims the benefit of EP Application Serial No. 15165050.4 filed on Apr. 24, 2015 and is incorporated herein by reference.

FIELD OF THE INVENTION

The invention pertains to a multi-channel transmit/receive radio frequency (RF) system for a magnetic resonance examination system.

Magnetic resonance imaging (MRI) methods utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field $B_0$ whose direction at the same time defines an axis (normally the z-axis) of the co-ordinate system to which the measurement is related. The magnetic field $B_0$ causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z-direction relaxes with a second and shorter time constant $T_2$ (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution of the magnetic resonance signals from the subject being imaged, such as a patient to be examined, constant magnetic field gradients extending along the three main axes are superposed on the uniform magnetic field B0, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance signal and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of constant magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo.

BACKGROUND OF THE INVENTION

A multi-channel transmit/receive radio frequency (RF) system for a magnetic resonance examination system is known from the paper 'Comprehensive RF safety concept for parallel transmission MR' in PIERS Proceedings, Cambridge, USA, Jul. 2-6, 2008 by I. Graesslin.

The known multi-channel transmit/receive radio frequency (RF) system comprises an RF antenna array, such as a multi-channel body coil or a (local) multi-element (RF) transmit array. A plurality of RF amplifiers is provided to individually activate the individual antenna elements of the RF antenna array. Further, pick-up coils are provided for each to the RF antenna elements. The electrical current of each pick-up element is monitored and compared with the demanded RF waveform. This enables to detect amplitude and phase deviations at the RF antenna elements and control local the specific absorption rate (SAR). The US patent application US2010/0167668 concerns monitoring a radiofrequency transmitter in a magnetic resonance tomography system.

SUMMARY OF THE INVENTION

An object of the present invention is to provide a multi-channel transmit/receive radio frequency (RF) system having SAR monitoring functionality requiring a less electronic components, notably on-board the coil or the coil-array.

This object is achieved by a multi-channel transmit/receive radio frequency (RF) system of the invention comprising
  an RF antenna array including multiple antenna elements
  an RF power supply to supply electrical RF power to the antenna elements
  directional couplers circuited between respective antenna elements and the power distributor, wherein a monitoring module configured to measure forward electrical wave amplitude(s) and reflected electrical wave amplitude(s) at individual directional couplers, an arithmetic module configured to compute the individual coil element currents on the basis of the measured forward and reflected electrical wave amplitudes.

According to the present invention, the forward and reflected wave amplitudes of the individual RF antenna elements are measured at the directional couplers associated with each of the RF antenna elements. For example, in an RF coil array, the RF antenna elements are formed by the coil elements of the array. At the directional couplers the forward and reflected wave amplitudes can be distinguished, but a high degree of directionality appears not needed for the purpose of the present invention. Thus, for the purpose of the present invention, actual directional couplers may be employed as well as other electronic components that have some degree of directional coupling. However, as in general there is a need to protect the RF amplifiers from reflected wave amplitudes by way of the actual directional couplers, it is easy to outcouple the forward and reflected wave amplitudes from these actual directional couplers. At the respective directional couplers a fraction of the forward and reflected (complex valued, e.g. magnitude and phase) wave amplitude of the RF antenna element associated with it, is coupled-out. From each of the directional couplers electrical signals, voltages or currents, are coupled-out which represents the forward and reflected wave amplitudes. That is, the coupled-out forward and reflected wave-amplitudes can be measured as an electrical voltage or current signal. The present invention achieves to determine the coil-currents, i.e. the electrical currents in each of the RF antenna elements from the individual forward and reflected wave amplitude measurements. Hence, the present invention avoids the need for additional pick-up coils and associated electrical circuits (in particular cabling) to control transmitted electromagnetic fields at the individual RF antenna elements. The invention applies for any signal source used to provide power for the RF antenna elements; this may be done by individual amplifiers for each of the RF antenna elements or less amplifiers than RF antenna elements can be used together with (a) power splitter(s). The actual i.e. physical, electrical coil-currents relate to linear combinations of the accessible signals that represent the forward and reflected electrical wave amplitudes coupled-out from the directional couplers. These linear combinations are represented by a distribution matrix, which in fact represents the distribution of forward signals and reflected signals among and from the RF antenna elements and reflections from the RF antenna elements in the part of the RF-chain between the directional couplers and the RF antenna elements, i.e. including any matching circuits.

The present invention uses a set of calibration measurements to directly access the linear combination of the measured forward and reflected wave amplitudes which describes the electrical currents in each of the RF antenna elements. That is, the distribution matrix elements are determined from the set of calibration measurements. This allows computing the actual electrical coil-currents from the measured parts of the wave amplitudes coupled-out at the directional couplers. Namely, the electrical currents in each of the RF antenna elements are calculated using the distribution matrix elements describing the linear combinations yielding the electrical currents that form the forward and reflected wave amplitudes that are measured at the directional couplers. In turn, from the computed actual electrical currents the $B_1$-field distribution generated by the RF antenna elements can be calculated.

According to the invention, from the measured out-coupled signals at the directional couplers the electrical currents in each of the individual RF antenna elements can be calculated. This calculation may be done in an approximation that cross-coupling between directional couplers is negligible. This, however, still allows for significant coupling between the RF antenna elements. This approximation enables to calibrate for a fair approximation of (the matrix elements of) the distribution matrix. From the actual electrical currents in each of the RF antenna elements (coils of an RF array) the emitted electrical field distribution and hence the actual SAR can be calculated Accordingly, once this linear combination is determined, or correspondingly the distribution matrix or a fair approximation for it (as the linear combination can be expressed by a matrix equation), the actual electrical coil-currents in the RF antenna elements can be calculated for any arbitrary excitation pattern from measured forward and reflected wave amplitudes. Thus, for a selected waveform of RF excitations which define its spatial excitation pattern, from the geometric configuration of the antenna elements and the calculated actual electrical currents in the antenna elements the rotating $B_1$-fields generated by the RF coil elements are computed. From these computed rotating B1-fields also the specific absorption rate (SAR) of RF energy deposited into an object to be calculated. Thus, the invention achieves to obtain the actual SAR involved in a particular magnetic resonance imaging method.

For the calibration measurements, the relation of the electrical coil-currents and the $B_1$-field for at least one position needs to be known for at least one coil loading, preferably for the empty coil or loaded with a small oil phantom.

Once calibrated, the rotating $B_1$-fields as well as the specific absorption rate (SAR) of RF energy deposited into an object, that are generated by the activated antenna elements can be accurately estimated from the measured coil element currents used for weighting patient-loaded coil simulations for any arbitrary excitation pattern, i.e. any set of amplitudes and phases generated by the individual RF amplifiers. This all works without the need of separate pick-up coils or other types of sensors which directly measure the individual electrical coil-currents e.g. by induced signals generated by local coil element currents. Hence, less cabling is needed so that the risk of common mode propagations is reduced. In a further aspect of the invention, a power distributor is coupled between the multiple amplifiers and the antenna elements so that less RF power amplifiers may be employed than the number of RF antenna elements.

These and other aspects of the invention will be further elaborated with reference to the embodiments defined in the dependent claims.

An insight of the present invention is that the distribution matrix describing the linear combinations of measured wave amplitudes and coil element currents is fairly approximated by a matrix of two diagonal blocks, viz. a forward diagonal block and a reflected diagonal block:

$$I - \begin{pmatrix} \alpha & \beta \end{pmatrix} \begin{pmatrix} a \\ b \end{pmatrix} \approx \begin{pmatrix} \alpha_{11} & 0 & 0 & \beta_{11} & 0 & 0 \\ 0 & \ldots & 0 & 0 & \ldots & 0 \\ 0 & 0 & \alpha_{NN} & 0 & 0 & \beta_{NN} \end{pmatrix} \begin{pmatrix} a_1 \\ \ldots \\ a_N \\ b_1 \\ \ldots \\ b_N \end{pmatrix}$$

In this equation, I is a vector containing the individual coil element currents, the matrix M=(α β) describes the linear combination of the forward (a) and reflected (b) wave amplitude vectors. It consists of two diagonal matrix blocks, denoted by α and β. This approximation holds because cross coupling between the individual RF chains beginning by the amplifier and ending behind the individual coil matching circuits is negligible. In practice, between the RF amplifier and at the remote end of the individual coil matching circuits, mostly well shielded cabling and lumped electronics are used which inherently have low mutual coupling. Note that this does not demand the coil elements to be well decoupled and the cross coupling among channels is dominated by coupling between the RF antenna elements themselves. The matrix elements of the forward (α) and reflected (β) diagonal matrix blocks can be calibrated by measuring, at a first defined tuned state, preferably tuned at or closely to resonance, of the RF antenna elements, the rotating B1 fields generated at a number of different forward wave amplitudes supplied by the power distributor, i.e. RF shim sets as well as measuring the forward (a) and reflected (b) wave amplitudes. The electrical currents in the RF antenna elements are directly related to the measured rotating $B_1$ fields. This relationship can be established e.g. from simulations of from (simplified approximate) computations based on e.g. the Biot/Savart law. In addition, further calibration measurements are performed also, at a second defined tuned state, notably with the detuned coil elements, or at a pre-defined loading condition. In that calibration measurement at fully detuned RF antenna elements measurement, the $B_1$ fields do not need to be measured, simply because the detuned RF antenna elements do not emit a (significant) rotating B1 field strength. In these measurements forward wave amplitudes generate reflected wave amplitudes that represent part of the way the signals are distributed between the RF antenna elements and the directional couplers.

Preferably, a number of independent RF shim sets of at the least the number of independently operated RF antenna elements is employed with the antenna elements in their tuned and detuned state. The above calibrations using the different first and second tuning states using a number of twice the element count N achieve to determine the 2N unknown matrix coefficients. There is no need to tune/detune individually. It is sufficient to measure tuned and detuned just once for the calibration. It appears even to be sufficient to just detune the coil once by e.g. employing a jumper switch, de-soldering a capacitor per element or shorting it. Once calibrated, the coil element in principle does not need to be detuned any more. Alternatively, the different first and second tuning states may be achieved by differently loading the RF antenna elements. An insight of the invention is that the structure of the RF channels is equal in both the tuned and detuned states that are employed in the calibration of the distribution matrix. This achieves that the calibration is relative insensitive to details of the RF channel structure.

The invention further pertains to a method determining individual coil element currents in a multi-channel transmit/receive radio frequency system for a magnetic resonance examination system. According to the invention this method further includes measuring forward electrical wave amplitude(s) and reflected electrical wave amplitude(s) at individual directional couplers in two or more pre-defined electrical conditions of supplying power to the antenna elements and compute the individual coil element currents on the basis of the measured forward and reflected electrical wave amplitudes. As explained, the invention avoids need for additional pick-up coils and associated electrical circuits (in particular cabling) to control transmitted electromagnetic fields at the individual RF antenna elements.

These and other aspects of the invention will be elucidated with reference to the embodiments described hereinafter and with reference to the accompanying drawing wherein

DETAILED DESCRIPTION OF THE EMBODIMENTS

Figure 1:
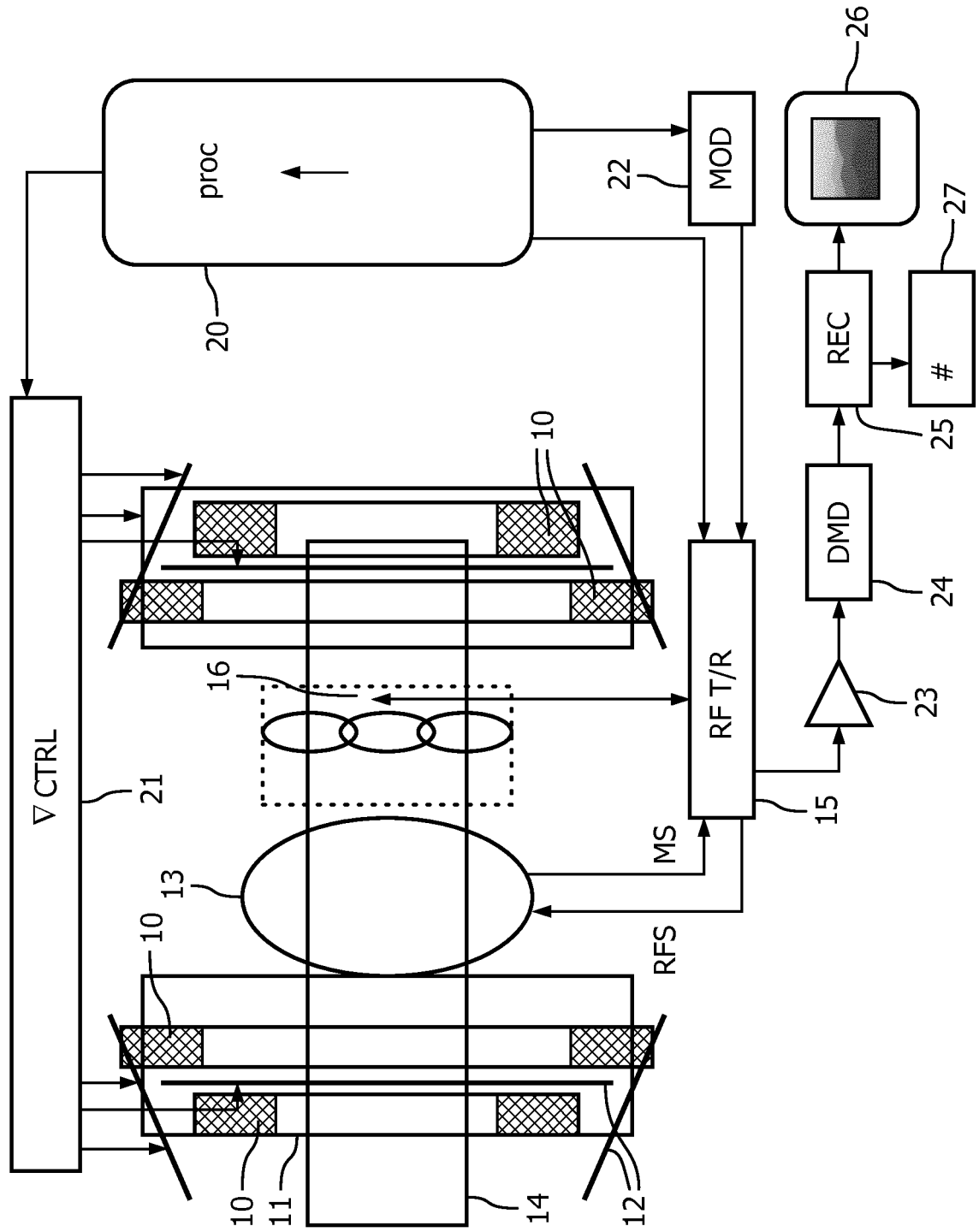
FIG. 1 shows a schematic representation of a magnetic resonance examination system in with the invention is employed.

FIG. 1 shows a schematic representation of a magnetic resonance examination system in with the invention is employed. The magnetic resonance imaging system includes a main magnet with a set of main coils 10 whereby the steady, uniform magnetic field is generated. The main coils are constructed, for example, in such a manner that they form a bore to enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energized by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape. The strength, direction and duration of the gradients are controlled by control of the power supply unit. The magnetic resonance imaging system also includes transmission and receiving antennae (coils or coil arrays) 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is generally used alternately as the transmission coil and the receiving coil. Typically, a receiving coil includes a multiplicity of elements, each typically forming a single loop. Various geometries of the shape of the loop and the arrangement of various elements are possible The transmission and receiving coil 13 is connected to an electronic transmission and receiving circuit 15.

It is to be noted that is that there is one (or a few) RF antenna elements that can act as transmit and receive; additionally, typically, the user may choose to employ an application-specific receive antenna that typically is formed as an array of receive-elements. For example, surface coil arrays 16 can be used as receiving and/or transmission coils. Such surface coil arrays have a high sensitivity in a comparatively small volume. The receiving coil is connected to a preamplifier 23. The preamplifier 23 amplifies the RF resonance signal (MS) received by the receiving coil 16 and the amplified RF resonance signal is applied to a demodulator 24. The receiving antennae, such as the surface coil arrays, are connected to a demodulator 24 and the received pre-amplified magnetic resonance signals (MS) are demodulated by means of the demodulator 24. The pre-amplifier 23 and demodulator 24 may be digitally implemented and integrated in the surface coil array The demodulated magnetic resonance signals (DMS) are applied to a reconstruction unit. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coil arrays 16 are coupled to the transmission and receive circuit by way of a wireless link. Magnetic resonance signal data received by the surface coil arrays 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction is applied to a monitor 26, so that the reconstructed magnetic resonance image can be displayed on the monitor. It is alternatively possible to store the signal from the reconstruction unit 25 in a buffer unit 27 while awaiting further processing or display.

The magnetic resonance imaging system according to the invention is also provided with a control unit 20, for example in the form of a computer which includes a (micro) processor. The control unit 20 controls the execution of the RF excitations and the application of the temporary gradient fields. To this end, software is loaded that, for example, includes instruction to carry-out imaging protocols including proper MR pulse sequences into the control unit 20 and the reconstruction unit 25. The control unit 20 in practice may form the system host computer.

Figure 2:
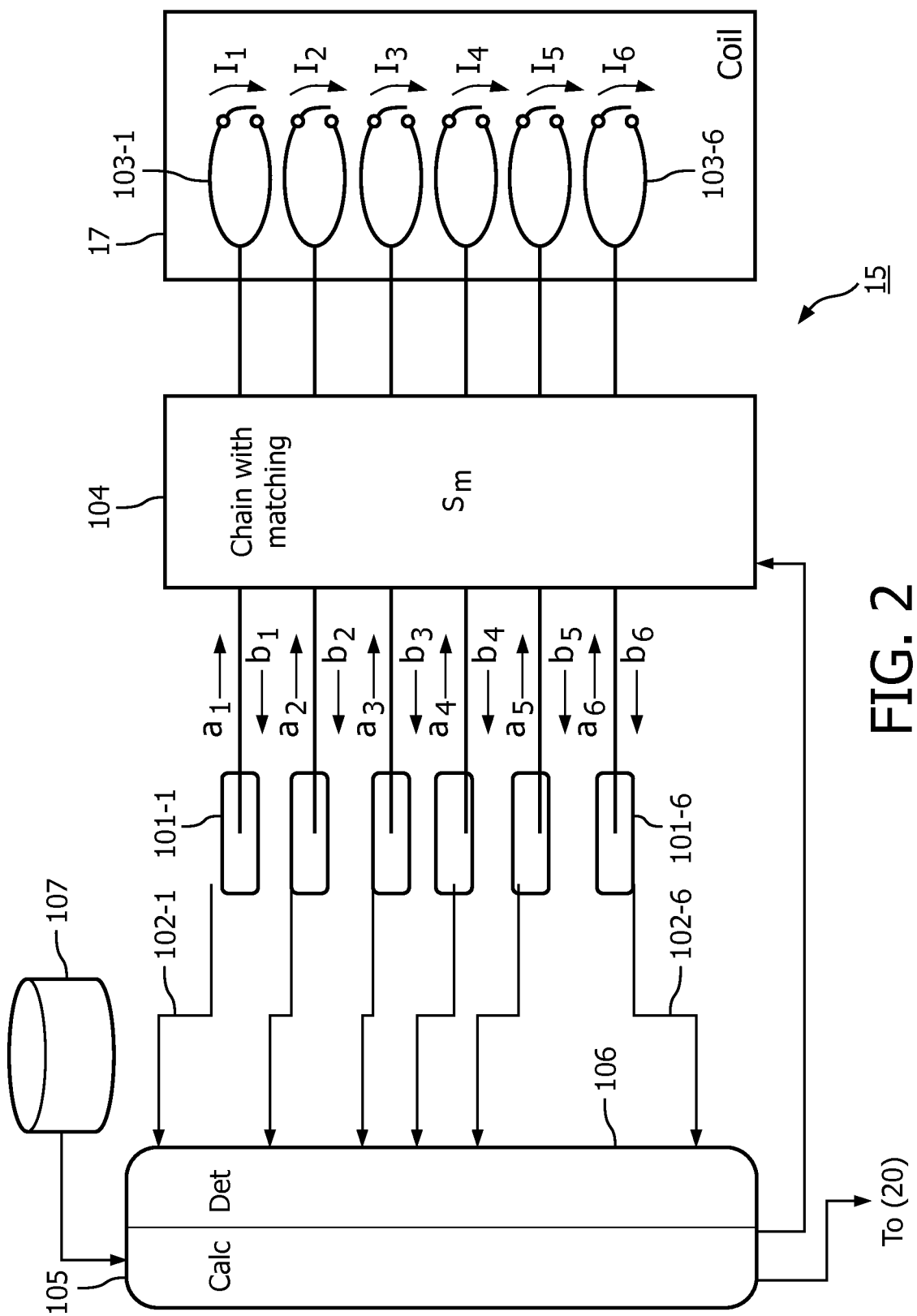
FIG. 2 shows a schematic representation of an RF coil array with the matching circuit coupled to multiple RF channels for use in the RF transmit/receive system of the magnetic resonance examination system of FIG. 1.

FIG. 2 shows a schematic representation of an RF coil array with the matching circuit coupled to multiple RF channels for use in the RF transmit/receive system of the magnetic resonance examination system of FIG. 1. The RF transmit/receive system employed in the invention is a multi-channel transmit/receive radiofrequency system. In the example six independent RF channels 102-1 to 102-6 are shown. These independent RF channels are coupled to the RF coil array 16. The RF coil array includes several RF antenna elements 103-1 to 103-6, in the form of RF coil elements or coil loops. Over the multiple, (i.e. six) RF channels 102-1, . . . 102-6 forward wave amplitudes ($a_i$) are transmitted from the RF amplifier via a matching circuit included in the matching chain 104 to the coil elements of the RF coil array. The forward power may be supplied from individual amplifier modules for each channel. Alternatively, less amplifier modules, e.g. one or just a few amplifier modules may be provided together with controllable power splitters to supply the forward wave amplitudes into each of the RF channels. Reflected, i.e. more generally returned or scattered wave amplitudes ($b_j$) return into the RF channels form the matching chain including the matching circuit. Directional couplers 101-1 . . . 101-6 are provided in each of the RF channels to block further transmission of the reflected wave amplitudes. Portions of the forward wave amplitude and of the reflected wave amplitude are coupled out from the directional couplers in each of the RF channels and fed into a detection circuit 105. This can be easily implemented by coupling-out the reflected and forward wave amplitudes over a length of cable to a 50Ω load at which an ADC samples the out-coupled voltage. It is noted that reflection and scattering of signals (waves) may occur from various parts of the signal channels. The detection circuit 105 with the ADC forms the monitoring module. The detected signal values of the detected forward and reflected wave amplitudes are fed into an arithmetic module 106. These detected signal values may be derived from the electrical currents and/or electrical voltages of the reflected and forward wave amplitudes. Alternatively, the forward and reflected wave-amplitudes may be derived from measurements at a defined location in the transmit chain (may be other than the measurements at the Note that the wave amplitudes generally have complex values as the wave amplitudes have both magnitude and phase. This arithmetic module 106 has access to the distribution matrix elements that describe the correspondence between the electrical currents in the RF antenna elements and the detected forward and reflected wave amplitudes. These distribution matrix elements are determined in the calibration step as described above and stored in a calibration memory 107. The arithmetic module 106 is further configured or programmed to compute the actual electrical currents in each of the coil elements 103-1 . . . 103-6 using the detected signal values and the distribution matrix elements. The arithmetic module 106 and the calibration memory 107 may be accommodated in the control unit or system host computer 20. The actual transmitted B1-field, electrical field components and accordingly the SAR-level can be calculated by the arithmetic module. These results can also be employed to control the amplifier system 23 and optionally also the matching circuit to control the wave amplitudes fed into the coil loops to control the transmitted B1-fields.

In other implementations a larger number, e.g. 32, 64 or even 128 or more independent RF channels may be employed. Further, the number of RF antenna elements, or coil elements in the RF coil array may be from 6, 32, 64 or even 128 or more.

The invention claimed is:

1. A multi-channel transmit/receive radio frequency (RF) system for a magnetic resonance examination system and comprising:

an RF antenna array including a plurality of N antenna elements;

a modulator configured to supply electrical waves to each of the antenna elements under control of a control processor at a predetermined input amplitude and phase and frequency band;

a plurality of directional couplers, each of the directional couplers circuited between a respective one of the plurality of antenna elements and the modulator;

a detector configured to measure forward electrical wave amplitude(s) and reflected electrical wave amplitude(s) at each of the directional couplers, in each of a tuned electrical condition of the corresponding antenna elements and a detuned electrical condition of the corresponding antenna elements, in the tuned condition the antenna elements are tuned to be resonant in the frequency band and in the detuned electrical condition the antenna elements are detuned to be non-resonant in the frequency band;

a memory configured to store a matrix M where $$M = \begin{pmatrix} \alpha_{11} & 0 & 0 & \beta_{11} & 0 & 0 \\ 0 & \ldots & 0 & 0 & \ldots & 0 \\ 0 & 0 & \alpha_{NN} & 0 & 0 & \beta_{NN} \end{pmatrix}$$

where matrix elements $\alpha$ are calculated during pre-imaging calibration for forward electrical waves, and matrix elements $\beta$ are calculated during pre-imaging calibration for reflected electrical waves; and an arithmetic processor configured to compute the individual antenna element currents $I_1, \ldots N$ on the basis of the measured forward electrical wave amplitudes $a, \ldots a_N$, and reflected electrical wave amplitudes $b_1, \ldots, b_N$, where $$I = M \begin{pmatrix} a_1 \\ \ldots \\ a_N \\ b_1 \\ \ldots \\ b_N \end{pmatrix}$$

where I is a vector containing the N individual antenna elements.

2. The multi-channel transmit/receive RF system as claimed in claim 1, wherein the arithmetic processor is further configured to calculate an RF field ($B_1$) strength for each of the antenna elements from the vector I based on the Biot-Savart law.

3. The multi-channel transmit/receive RF system as claimed in claim 2, wherein the arithmetic processor is further configured to calculate the specific absorption rate (SAR) for each of the N antenna elements.

4. The multi-channel transmit/receive RF system as claimed in claim 3, wherein the control processor is configured to control the modulator to adjust the electrical waves supplied to each antenna element based on the calculated SAR for each antenna element.

5. The multi-channel transmit/receive RF system as claimed in claim 1, further including a reconstruction processor configured to reconstruct resonance signals received by the antenna elements into an image for display on a monitor.

* * * * *